US008144759B2

(12) United States Patent
Mikhael et al.

(10) Patent No.: US 8,144,759 B2
(45) Date of Patent: Mar. 27, 2012

(54) ADAPTIVE METHODS EMPLOYING OPTIMAL CONVERGENCE FACTORS FOR PROCESSING COMPLEX SIGNALS AND SYSTEMS

(75) Inventors: Wasfy B. Mikhael, Winter Springs, FL (US); Raghuram Ranganathan, Orlando, FL (US)

(73) Assignee: University of Central Florida Research Foundation, Inc., Orlando, FL (US)

(*) Notice: Subject to any disclaimer, the term of this patent is extended or adjusted under 35 U.S.C. 154(b) by 591 days.

(21) Appl. No.: 12/150,995

(22) Filed: May 2, 2008

(65) Prior Publication Data
US 2008/0273639 A1 Nov. 6, 2008

Related U.S. Application Data

(60) Provisional application No. 60/927,821, filed on May 4, 2007.

(51) Int. Cl.
*H03H 7/30* (2006.01)
*H03H 7/40* (2006.01)
*H03K 5/159* (2006.01)

(52) U.S. Cl. ........ 375/233; 375/232; 375/234; 375/235; 375/350; 708/322; 708/323

(58) Field of Classification Search .......... 375/232–235, 375/350; 708/322, 323; 455/63.1, 114.2, 455/296, 307
See application file for complete search history.

(56) References Cited

U.S. PATENT DOCUMENTS

| | | | |
|---|---|---|---|
| 5,243,624 A * | 9/1993 | Paik et al. | 375/232 |
| 5,805,481 A | 9/1998 | Raghunath | |
| 6,381,623 B1 | 4/2002 | Schenk | |
| 7,016,371 B1 | 3/2006 | Petranovich | |
| 7,061,977 B2 | 6/2006 | Martin | |
| 7,170,924 B2 | 1/2007 | Carbaton et al. | |
| 2004/0171385 A1 | 9/2004 | Haustein et al. | |

OTHER PUBLICATIONS

T.Yang, W. Mikhael, Optimum Block Adaptive Algorithm for Gradient Based Independent Component Analysis (OBA/ICA) for Time Varying Wireless Channels, University of Central Florida, Embry-Riddle Aeronautical University, pp. 2240-2243, (published 2005).
Ella Bingham, Aapo Hyvarinen, A Fast Fixed-Point Algorithm for Independent Component Analysis of Complex Valued Signals, International Journal of Neural Systems, vol. 10, Feb. 2000, pp. 1-8.
R. Ranganathan. W. B. Mikhael, Fast-Converging Complex Adaptive Algorithm for Diversity Wireless Receivers in Linearly Fading Channels, Electronic Letters Jul. 20, 2006, vol. 42, No. 15. Wasfy B. Mikhael, Raghuram Ranganathan, Complex Adaptive FIR Digital Filtering Algorithm with Time-Varying Independent Convergence Factors, Signal Processing Jan. 26, 2008. vol. 88, pp. 1889-1993.
Bernard Widrow, et al., "The Complex LMS Algorithm", Oct. 18, 1974, Proceedings Letters, pp. 719-720.

* cited by examiner

*Primary Examiner* — Phuong Phu
(74) *Attorney, Agent, or Firm* — Jetter & Associates, P.A.

(57) ABSTRACT

Complex adaptive methods for complex information processing employ optimal individual convergence factors for real and imaginary components of the weight vector. For wireless receivers operating on QPSK, a Complex IA-ICA performs better than existing Complex Fast-ICA methods in terms of accuracy and convergence speed, can process such complex signals in time-varying channels, and employs time-varying and time-invariant convergence factors, independent for the real and imaginary components of the system parameters, and provide individual or group system parameter adjustments. Such systems employ the within complex adaptive ICA with individual element adaptation (Complex IA-ICA). In adaptive beamforming, system identification and other adaptive systems based on the Least Squares method, complex least mean square methods, with optimally and automatically derived convergence factors, are employed and which perform much better in terms of convergence speed and accuracy, when compared to the traditional Complex LMS and Block Complex LMS methods.

20 Claims, 13 Drawing Sheets

ADAPTIVE EQUALIZATION

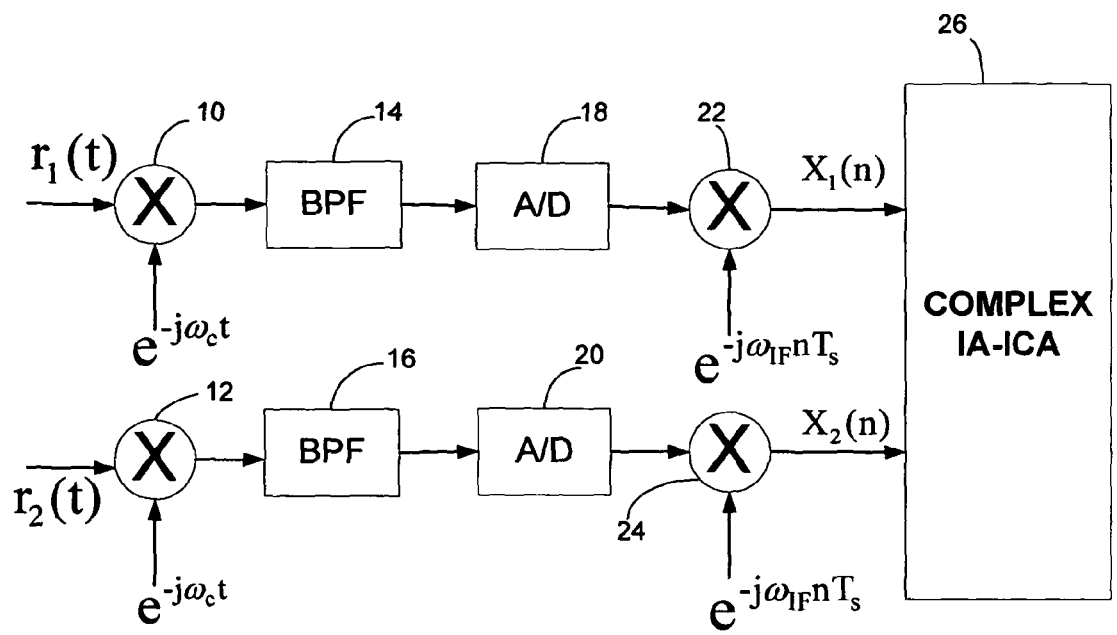
FIG.1: Low-IF Diversity Wireless Receiver Structure

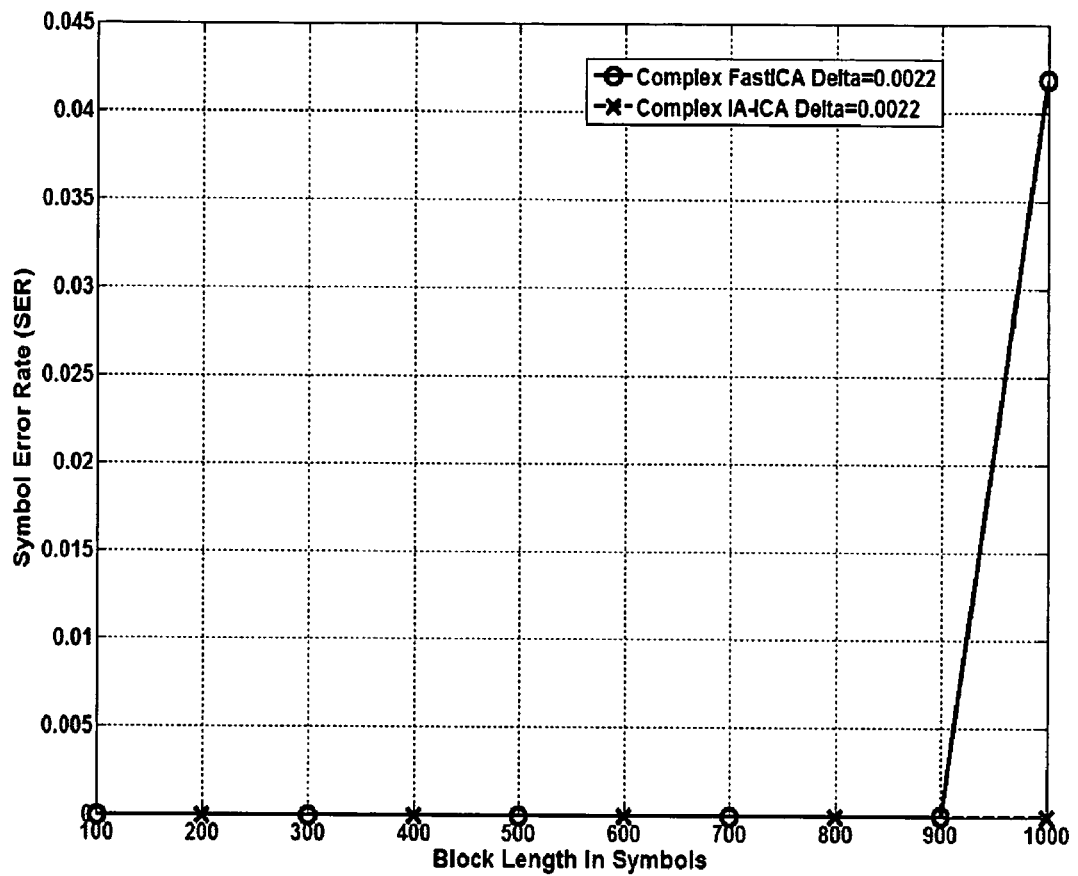
FIG.2 : SER achieved in Linearly Fading Channels

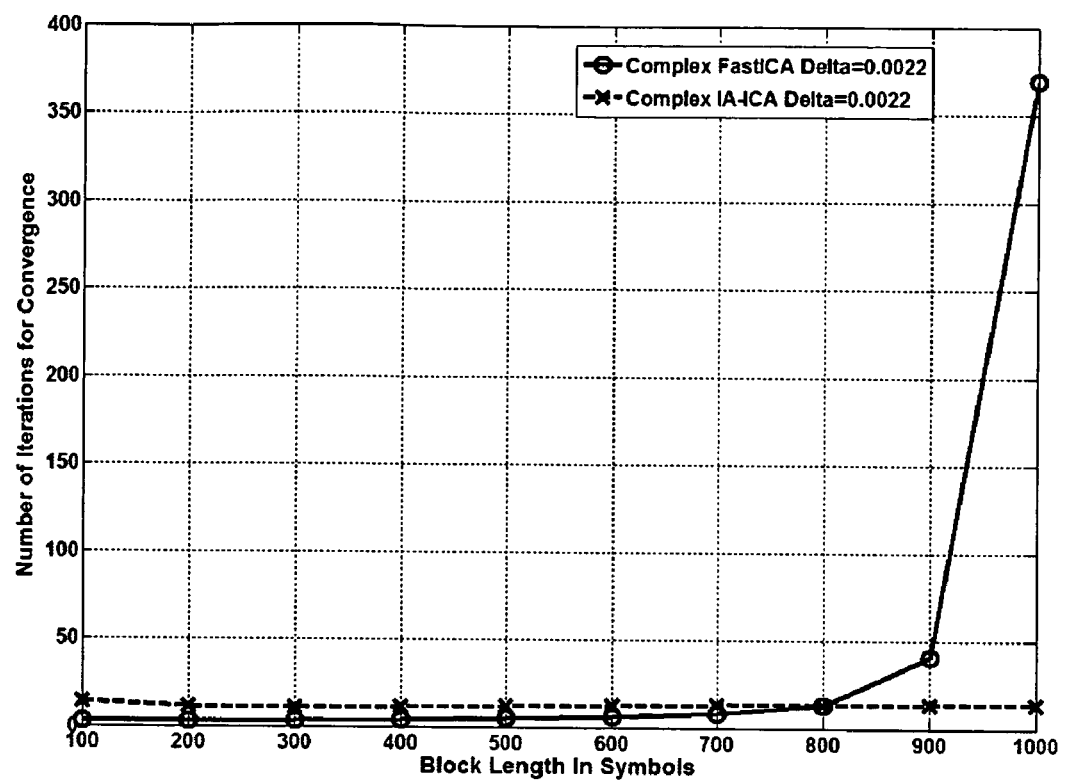
FIG. 3: Number of Iterations for Convergence in Linearly Fading Channels

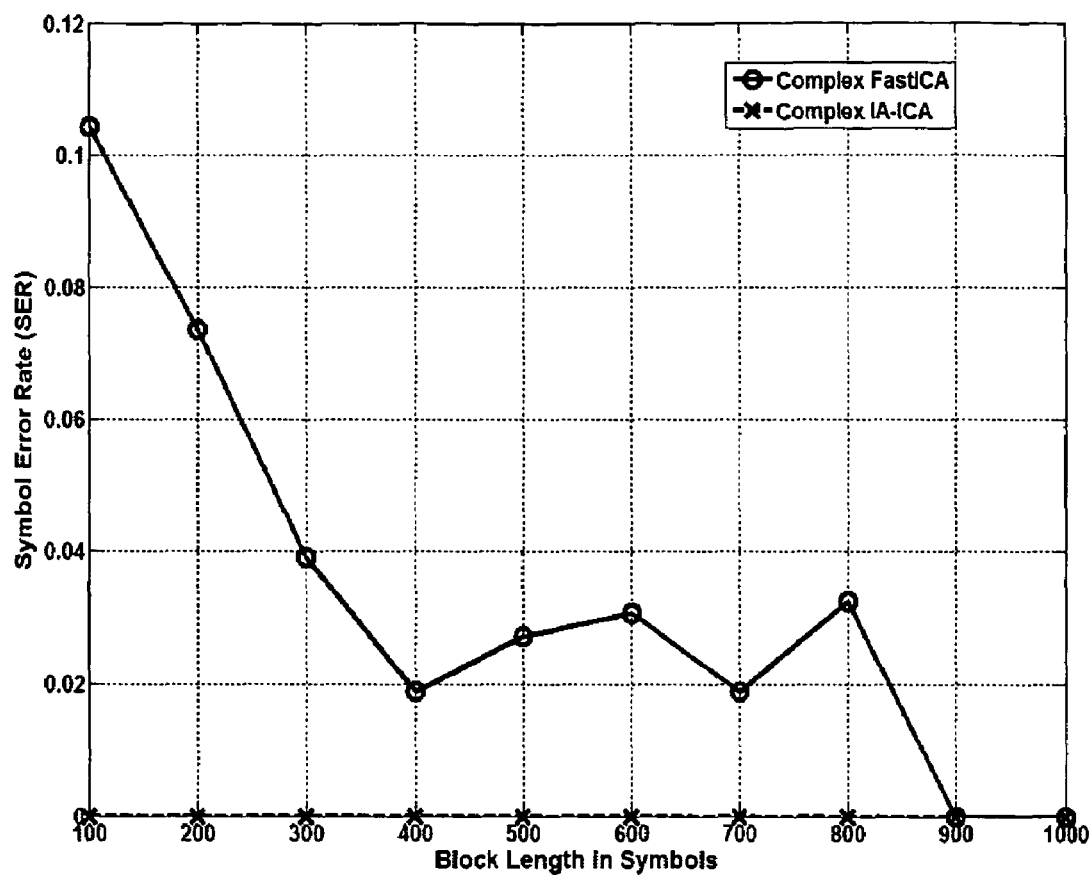
FIG. 4: SER achieved in Abruptly Fading Channels

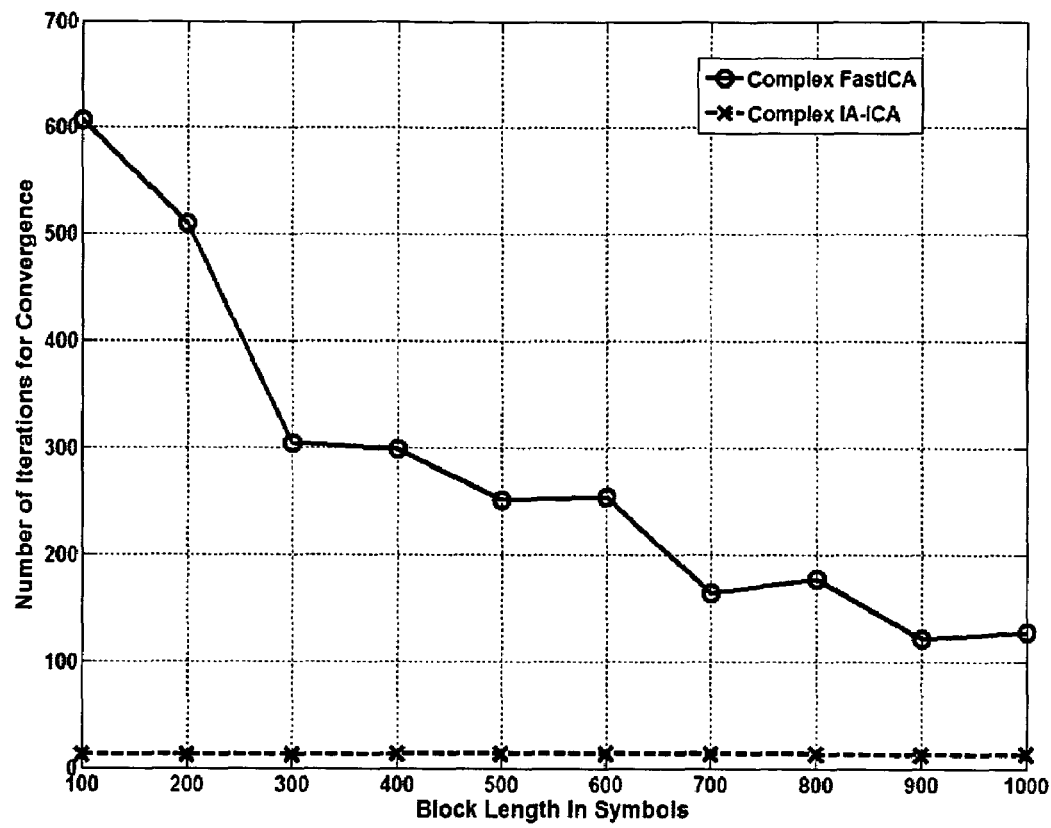
FIG.5 : Number of iterations for convergence in abruptly fading channels

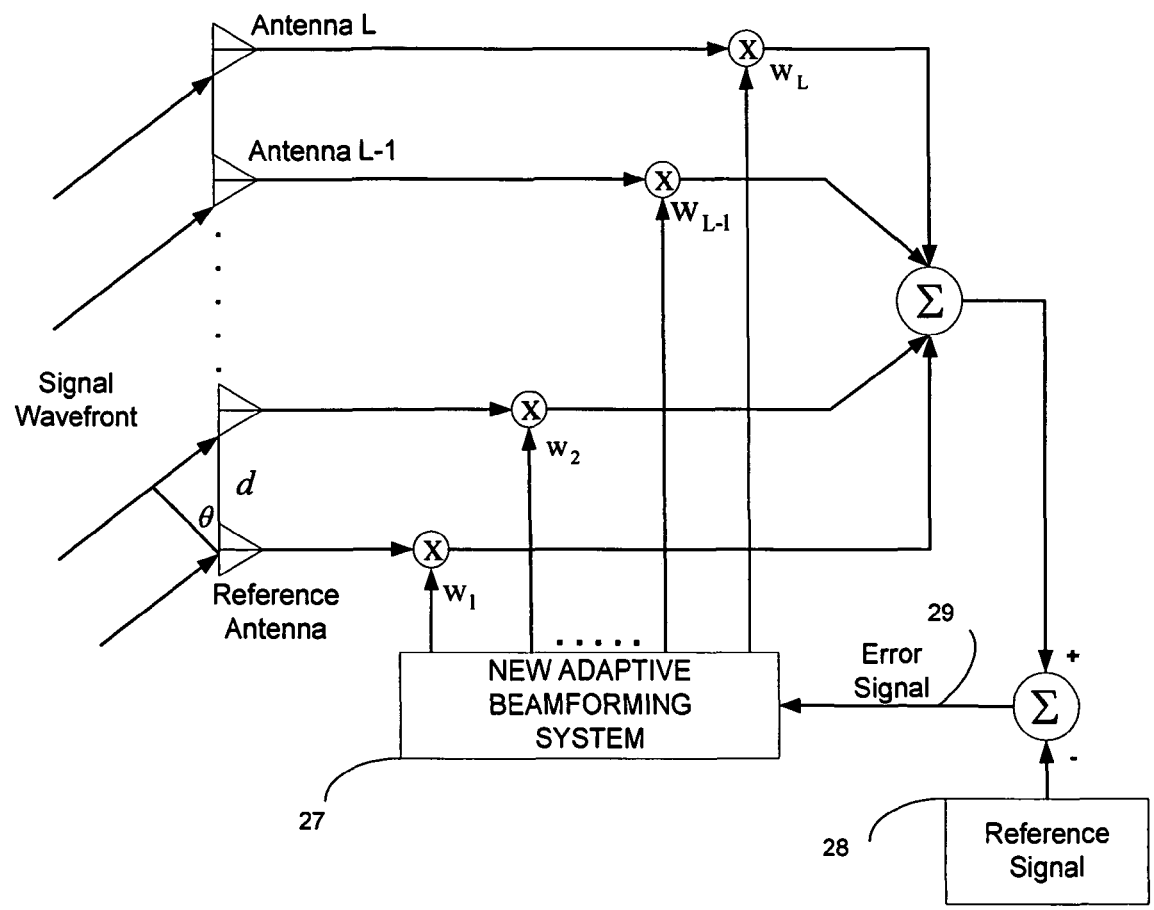
FIG.6: Adaptive Beamforming System

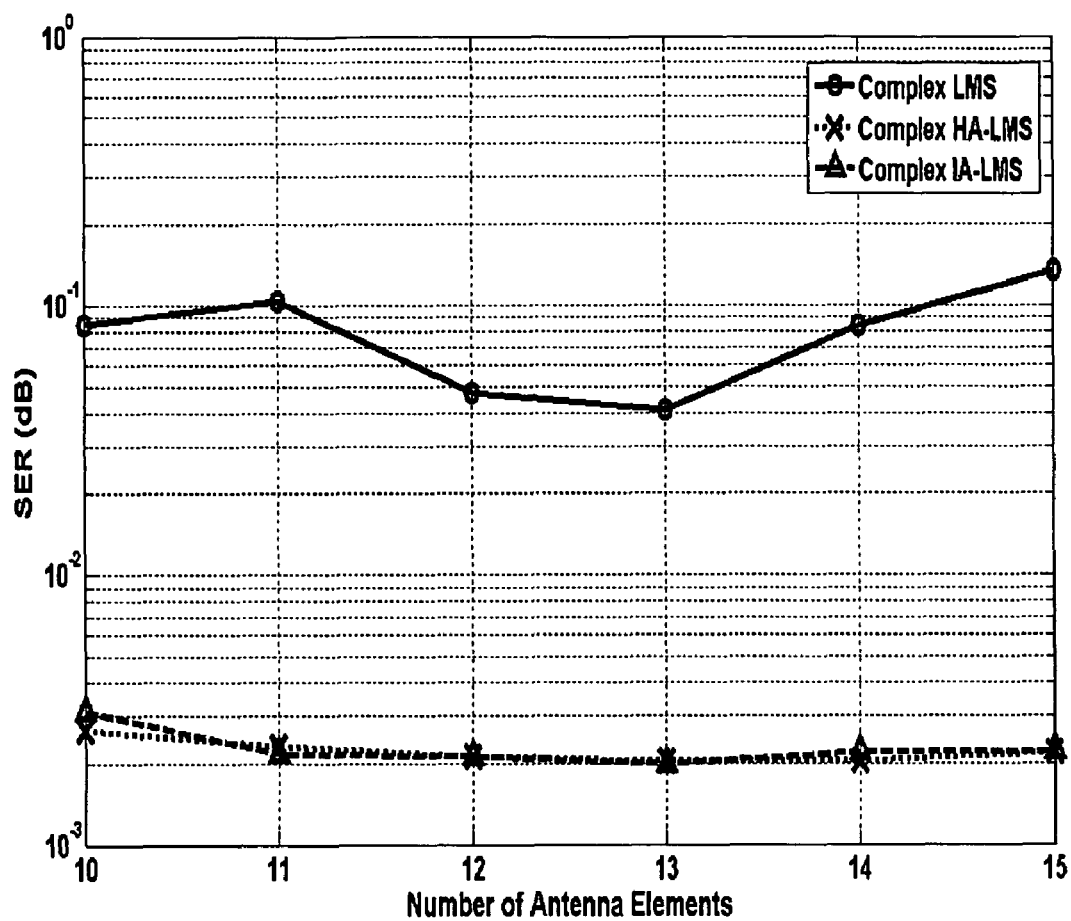
FIG. 7: SER (dB) vs. $L$ for QAM user signaling with $SIR_i = 0$ dB for all $i$

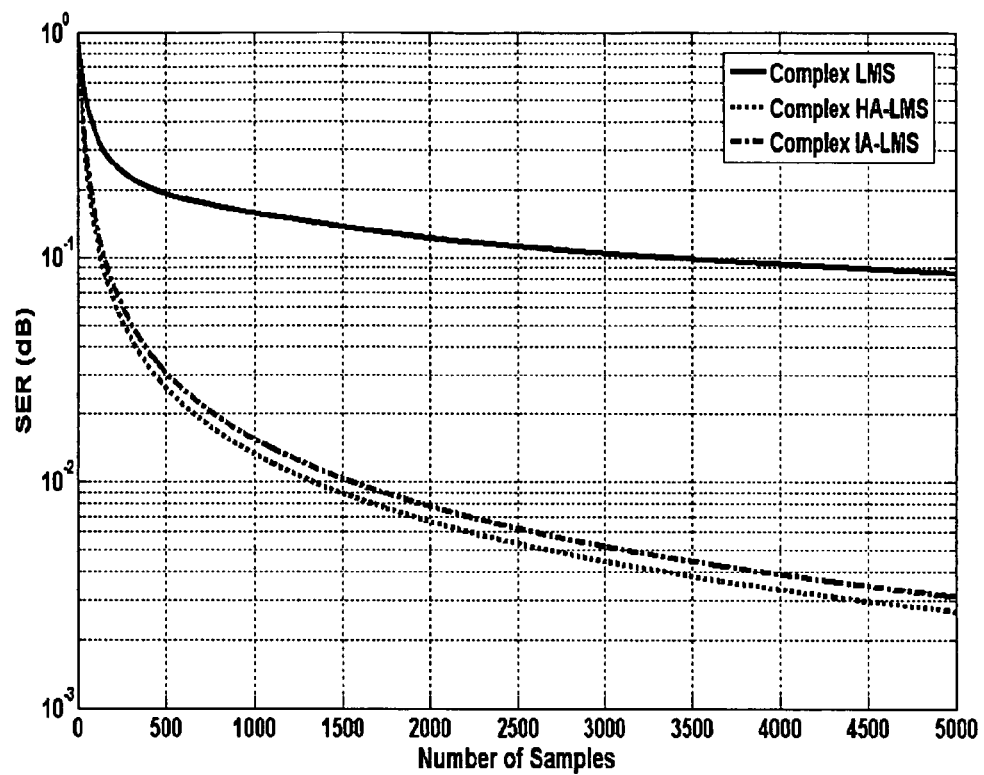
FIG.8: SER (dB) vs. Number of processed samples for QAM user signaling with $SIR_i =$ 0 dB for all $I$, and $L=10$

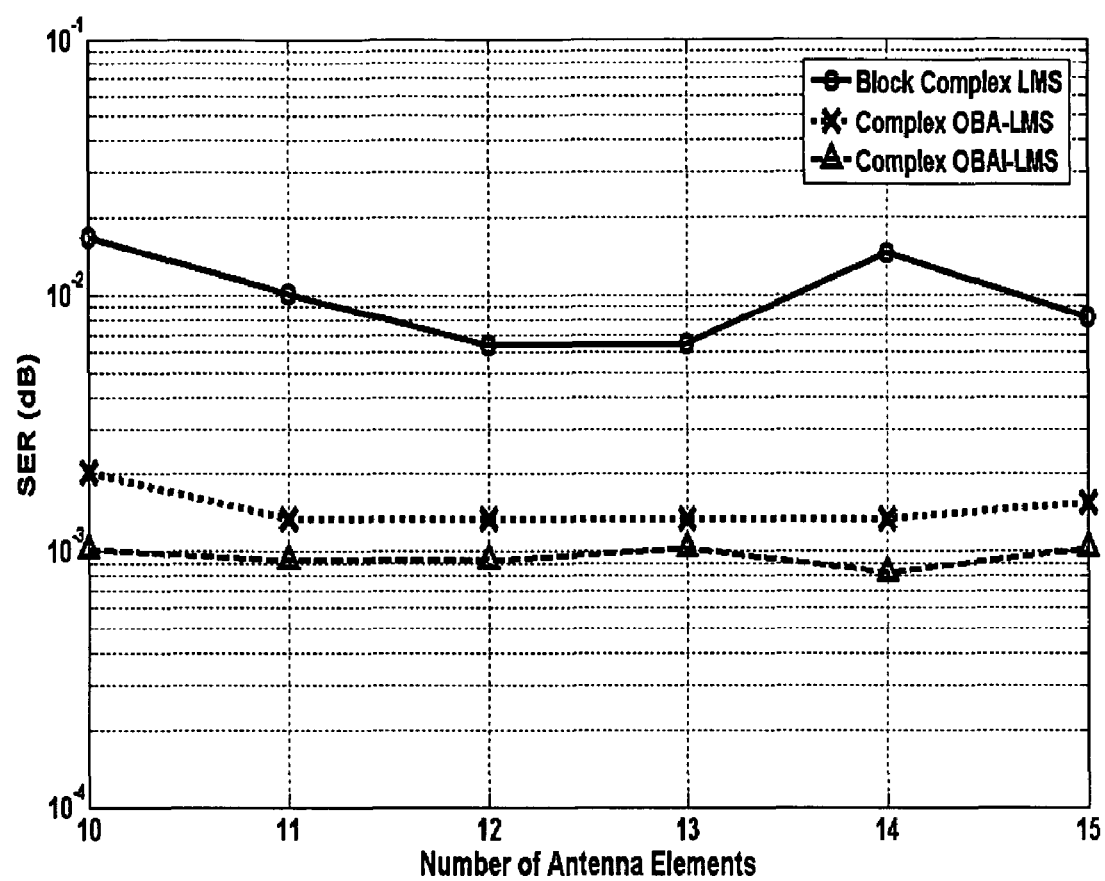
FIG.9: SER (dB) vs. $L$ for QAM user signaling with $SIR_i = 0$ dB for all $i$

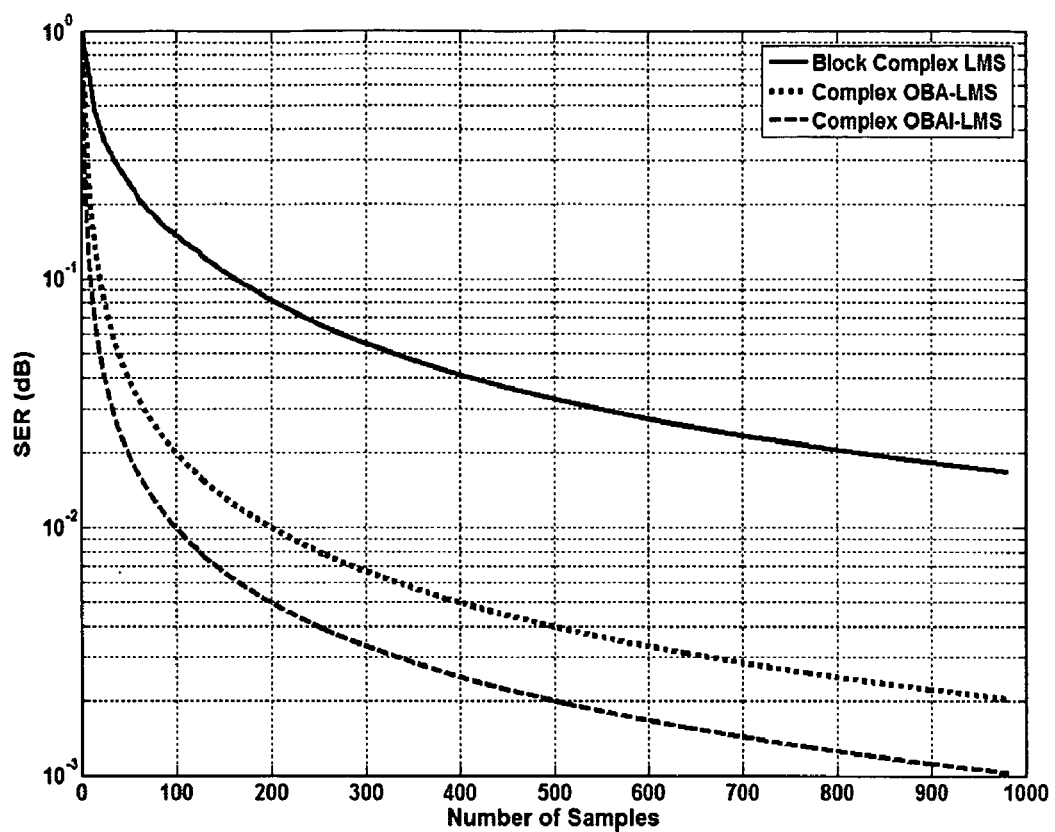
FIG. 10: SER (dB) vs. Number of processed samples for QAM user signaling with
SIR$_i$ = 0 dB for all $i$, and $L$=10

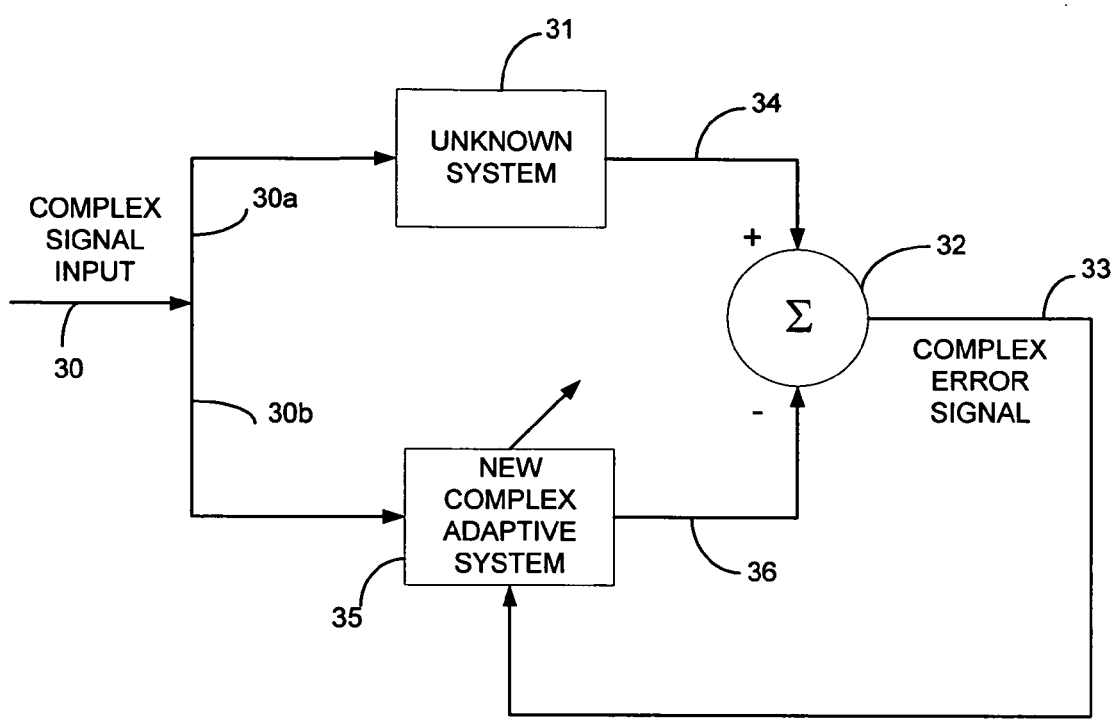
FIG.11 SYSTEM IDENTIFICATION

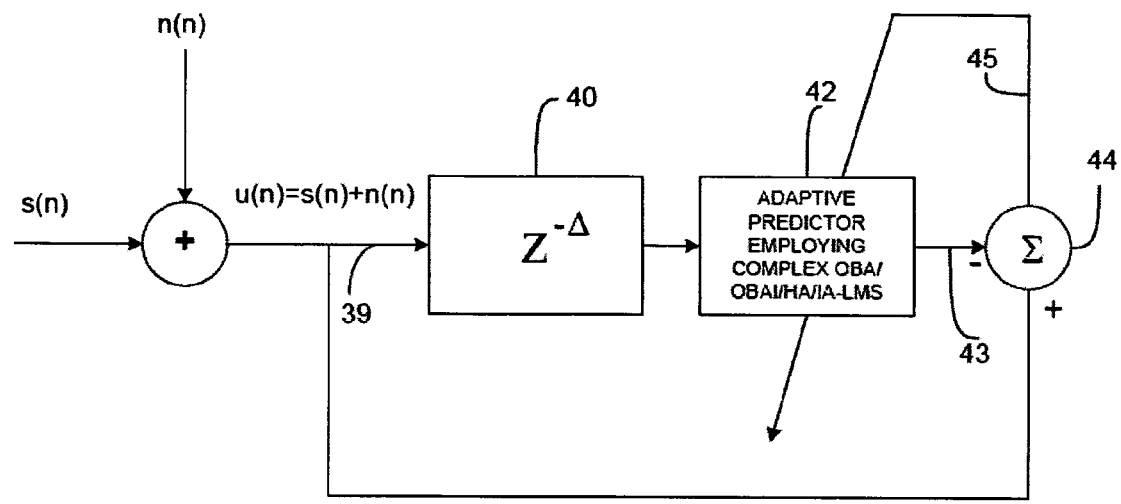
FIG.12 ADAPTIVE LINE ENHANCER

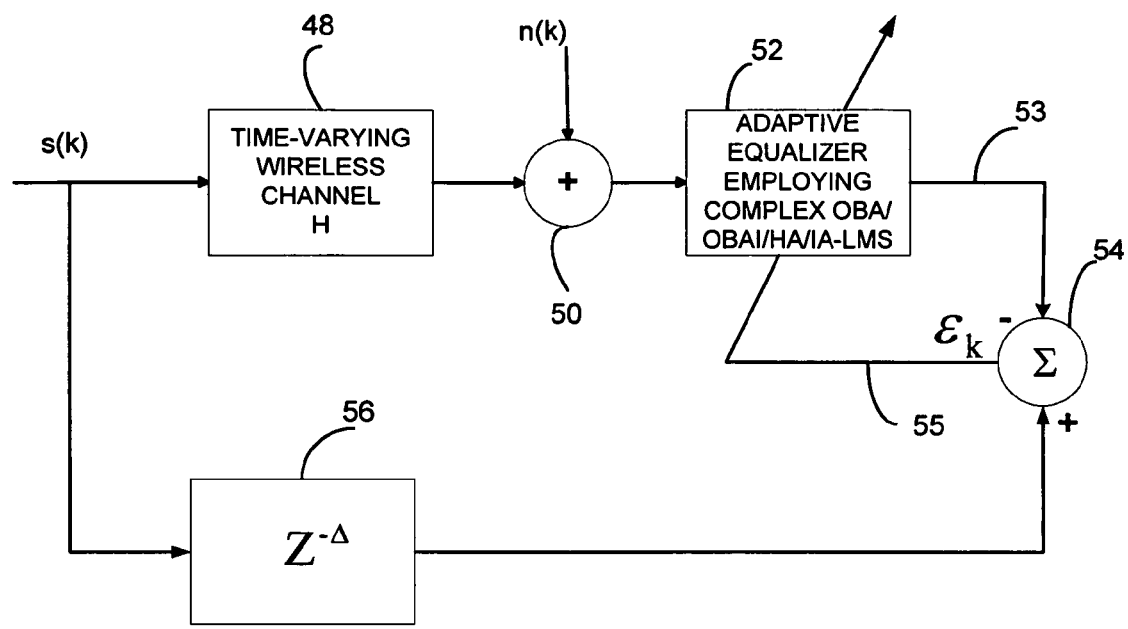
FIG.13 ADAPTIVE EQUALIZATION

ADAPTIVE METHODS EMPLOYING OPTIMAL CONVERGENCE FACTORS FOR PROCESSING COMPLEX SIGNALS AND SYSTEMS

CROSS REFERENCE TO RELATED APPLICATION

This application claims the benefit under 35 USC 119 (e) of the provisional patent application Ser. No. 60/927,821, filed May 4, 2007, which is herein incorporated by reference in its entirety.

FIELD OF INVENTION

In complex information processing, methods for optimally adapting signal parameters in a complex signal and system environment is presented.

BACKGROUND OF THE INVENTION

In wireless communications, fixed-point complex ICA methods have been applied to perform separation of complex valued signals in a time variant environment in which various components of signals, or the signal per se, is time variant. Such ICA methods suffer from various limitations where the channel is constantly or abruptly changing. For adaptive filtering applications such as beamforming and system identification, and the Complex LMS method has been widely used both in block and sequential mode, due to its computational simplicity and relative ease of implementation. However, the main drawback of the Complex LMS method is its slow convergence. In addition, the performance is highly dependent on the choice of the convergence factor or learning rate which is constant and has to be manually selected by trial and error depending on the type of application. Furthermore, an incorrect choice of convergence factor could even result in divergence. Various methods of adaptive filtering or processing of such complex signals in time variant channels have been suggested in the art, these, for example, including:
 1. LMS—an algorithm when slow convergence is not a major issue (typically used).
 2. NLMS—simple extension of the LMS with much faster convergence in many cases (commonly used).
 3. Frequency-domain methods—offer computational savings for long filters and usually offer faster convergence commonly used when there are already FFTs in the system.
 4. Lattice methods—are stable and converge quickly, but cost substantially more than LMS and have higher residual MSE than other methods (occasionally used).
 5. RLS—algorithms that converge quickly and are stable. However, they are considerably more expensive than LMS (almost never used).
 6. Block RLS—(least squares) methods, which can be efficient in some cases (occasionally used).
 7. IIR—Difficult to implement successfully, but used in some applications, for example noise cancellation of low frequency noise.
 8. CMA—useful when applicable to (blind equalization); CMA is preferred method for blind equalizer initialization (commonly used in specific equalization applications).

A block adaptive method for gradient based ICA has been proposed by one of the within co-inventors (W. Mikhael). See Mikhael and Yang: "Optimum Block Adaptive (OBA) Algorithm for Gradient Based ICA for Time Varying Wireless Channels." Proc 62 IEEE Vehicular Technology Conf., Dallas, Tex., USA, September 2005. Said paper teaches a fixed point ICA analysis method which includes an optimum block adaptive aspect. The so-called OBA/ICA is capable of tracking time variation. Simulation results from mobile telecommunication applications thereof indicate the resulting performance, particularly, with respect to convergence properties, is superior to fast-ICA under dynamic channel conditions.

Unlike the OBA/ICA, the Complex IA-ICA has the capability to process complex signals. The need for such improvement is attributable to the fact that complex signal processing systems do not possess sufficient degrees of freedom in certain applications. Due to this, there is a constant need for systems capable of adapting, in real time, to rapid and abrupt channel spatial and other changes. Although the prior art, as best known to the within inventors includes the 2000 publication of Bingham and Hyvarinen: "A Fast Fixed Point Algorithm for ICA of Complex Valued Signals." Int. J. Neural Syst., 2000, 10, 1, pp. 1-8. Bingham et al teaches ICA as an improved statistical method for transforming an observed multidimensional random vector into components that are mutually as independent as possible. Therein, in the prior art, a fast fixed point algorithm was capable of separating complex values of mixed source signals as they existed at that time, and with a computational efficiency considered reasonable for the state-of-art in 1999. Today's needs however are different.

Applicable issues associated with adaptive signal filtering and processing are addressed by U.S. Pat. No. 5,805,481 (1998) to Raghunath, entitled Update Block for an Adaptive Equalizer Filter Configuration Capable of Processing Complex-Valued Coefficient Signals; U.S. Pat. No. 6,381,623 (2002) to Schenk, entitled Method for Adaptive Filter Adjustment in a QAM/Cap System; U.S. Application Publication US/2004/0171385 A1 (2004) to Haustein et al, entitled Adaptive Signal Processing Method in a MIMO-System; U.S. Pat. No. 7,061,977 (2006) to Martin et al, entitled Apparatus and Method for Using Adaptive Algorithms to Exploit Sparsity in Target Weight Vectors in an Adaptive Channel Equalizer and U.S. Pat. No. 7,170,924 (2007) to Corbaton, each relative to adaptive methods for adjustment of weight vectors.

None of the above art however suggests the novel methods of adaptive signal processing set forth herein.

Prior art wireless systems, employing complex fast ICA are highly efficient and popular in applications involving the separation of complex signals. Their performance however degrades in time-varying channel situations. In practice, such situations frequently arise in wireless communications when the signal propagates between the transmitter and receiver many factors may of course intervene to corrupt the signal. Therefore, prior art complex fast ICA methods are impractical in certain real time applications. It has been found that the present inventive method employing our novel complex IA-ICA technique functions successfully under both slow and abrupt variations in complex wireless channels.

The within inventors have authored the article entitled "Fast-Converging Complex Adaptive Algorithm for Diversity Wireless Receivers in Linearly Fading Channels, Electronic Letters, Vol. 42, No. 15 (Jul. 20, 2006) which was originally addressed in the provisional application to which this application claims priority. In 2008, the within inventors also authored the article "Complex Adaptive FIR Adaptive Filtering algorithm with Time-Varying Independent Convergence Factors," which was published in Signal Processing, Volume 88, Issue 7, January 2008, pp. 1889-1893.

Other adaptive systems employing the Complex Least Mean Square (Complex LMS) method in both block mode and sequential mode have been widely used in various adaptive filtering applications because of its computational simplicity and relative ease of implementation. However, the inherent limitation of the Complex LMS is its dependence on the convergence factor or step size, which their fixed and has to be manually selected depending on the type of application or nature of the input signal. Moreover, a small step size results in slow convergence, and a large step size could cause unstable gradient descent, leading to divergence. Hence, the optimal convergence factor has to be chosen by trial and error. The invented adaptive systems employing our novel Complex OBA-LMS, Complex OBAI-LMS, Complex HA-LMS, and Complex IA-LMS techniques yield excellent convergence properties, in terms of convergence speed and accuracy.

The instant improvement will, it is anticipated, find important application in areas, including, without limitation, communications, speech identification, system modeling, event prediction, line quality enhancement, signal equalization, audio, speech and video processing. Generally, interference suppression in wireless communications, system identification, system modeling, predictive algorithms, and the above areas will all benefit from the cost and functionally efficient interference suppression accomplished by the present invention.

GLOSSARY OF TERMS

The following terms, as defined below, are employed in this application.

Adaptive Equalizer. An inverse filter designed to cancel out signal distortion.

Baseband. Describes signals and systems whose range of frequencies is measured from 0 to a maximum bandwidth or highest signal frequency. It is sometimes used as a noun for a band of frequencies starting at 0. It can often be considered as synonym to lowpass, and antonym to passband.

Block size. The length of a bit string, which in many applications, such as block ciphers, comprises a fixed length string of bits.

Convergence factor. Is a scalar or vector parameter that controls the stability and the rate of adaptation (rate of convergence properties) of a complex adaptive signal processing algorithm by minimizing the gradient function of the complex adaptive signal processing algorithm.

Covariant matrices. If X and Y are matrices reflective of a process, the correlations between the columns of X and the columns of Y are the covariance between the matrices. This is often written as cov (X,Y).

Eigenvalue. A constant factor by which an eigenvector is transformed to produce an eigenspace for a factor that is the set of eigenvectors with that factor as an eigenvalue.

Fourier transform. A linear operator that matches functions to other functions. Generally, a Fourier transform decomposes a function into a continuous spectrum of its frequency components, and an inverse Fourier transform synthesizes a function from its spectrum of frequency components.

FFT. An abbreviation for Fast Fourier Transform. FFT algorithms are computationally efficient methods for computing Discreet Fourier Transforms (DFT).

Hermitian matrix. A square matrix a with complex entries, which is equal to its own conjugate transpose, i.e., the element in the i th row and the j th column is equal to the complex conjugate of the element in the j row of the i column, for all indices of i and j:

$$a_{i,j} = \overline{a_{j,i}}$$

or written with the conjugate transpose A*:

$$A = A^*$$

For example, $$\begin{bmatrix} 3 & 2+i \\ 2-i & 1 \end{bmatrix}$$

is a Hermitian matrix. The entries on the main diagonal (top left to bottom right) of any Hermitian matrix are necessarily real. A matrix that has only real entries is Hermitian if and only if it is a symmetric matrix, i.e., if it is symmetric with respect to the main diagonal.

ICA or Independent Component Analysis. A specific method for transforming and observing a multidimensional random vector into components that are as mutually independent as possible. The basic ICA model is X=AS. X is the observation matrix, A is the mixing matrix, and S is the source signal matrix consisting of independent components. The objective of ICA is to find a separation matrix W, such as can be recovered when the observation matrix X is multiplied by W. This is achieved by making each component in WX as independent as possible.

Kurtosis. In statistics, a measure of whether data thereof are peaked or flat relative to a normal distribution. High kurtosis indicates a distinct peak near the mean, with rapid decline therefrom. Data with low kurtosis tends to have a flat top near the mean (as opposed to a sharp peak).

Observation Matrix. A matrix that operates on a state of values x to express what the value of the data would have been in the absence of data errors.

QAM or Quadrature Amplitude Modulation. A modulation scheme which conveys data by changing or modulating the amplitude of two carrier waves, typically sinusoids, out of phase with each other by ninety degrees.

Rayleigh Distribution: In probability theory and statistics, the continuous probability distribution typically arising when a two-dimensional vector has two orthogonal components normal but independently distributed. The absolute (scalar) value of the two-dimensional vector will then have a Rayleigh distribution. Such distribution may also arise in the case of random complex numbers whose real and imaginary components are normally and independently distributed. The absolute value of these numbers would then be Rayleigh distributed and may be expressed as a probability density or cumulative distribution function.

RMS or Root Mean Square. In statistics, a measure of magnitudes of varying quantities, having special utility when the variates are positive and negative, e.g., waves or sinusoids.

Weight Vector or Matrix. A set of factors, each having a correspondence to a respective element of an input vector or matrix element.

Wiener Filter. In information theory, the use of a statistical transform filter-out or whiten noise that has corrupted a signal, where the spectral properties of the original signal and the noise to be filtered are generally known.

SUMMARY OF THE INVENTION

Novel complex adaptive methods for complex information processing employ optimal individual convergence factors for real and imaginary components of a weight vector. For wireless receivers operating on Quadrature Phase Shift Keying (QPSK), the Complex IA-ICA performs better than existing complex fast-ICA methods in terms of accuracy and convergence speed, processes such complex signals in time-varying channels, and employs time-varying and time-invariant convergence factors which are independent for the real and imaginary components of the system parameters, in addition to providing individual or group system parameter adjustments. Such systems employ the within complex adaptive ICA with individual element adaptation (Complex IA-ICA). With regards to adaptive beamforming, system identification and various other adaptive systems based on the Least Squares method, novel complex least mean square methods with optimally and automatically derived convergence factors (Complex OBA-LMS Complex OBAI-LMS, Complex HA-LMS and Complex IA-LMS) are employed, which perform much better in terms of convergence speed and accuracy, when compared to the traditional Complex LMS and Block Complex LMS methods.

It is an object of the present invention to provide a method of adaptive signal processing in which optimal convergence factors are automatically derived and updated at each iteration for each independent component of a complex weight vector to attain a convergence thereof.

It is a further object to provide a system for adapting the system parameters in a complex signal and system environment.

The above and yet other objects and advantages of the present invention will become apparent from the hereinafter Brief Description of the Drawings and Detailed Description of the Invention.

BRIEF DESCRIPTION OF THE DRAWINGS

FIG. 1 is a block diagram showing application of the inventive complex individually adaptive/independent component analysis (complex IA-ICA) method applied to a wireless communication system.

FIG. 2 is graph showing the signal-to-error ratio (SER) achieved by the inventive method in linearly fading channels.

FIG. 3 is a graph showing the number of iterations needed for convergence in the inventive method for linearly flat fading channels.

FIG. 4 is graph showing the SER achieved in abruptly flat fading channels.

FIG. 5 is a graph showing the number of iterations needed for convergence in the inventive method for abruptly flat fading channels.

FIG. 6 is a block diagram showing use of the invented method with respect to adaptive beamforming.

FIG. 7 is a graph showing the SER achieved for different number of antenna elements for QAM user signaling, with sequential processing of the complex input signal.

FIG. 8 is a graph showing the speed of convergence for QAM user signaling for a ten antenna element beamforming system, adopting sequential processing of the complex input signal.

FIG. 9 is a graph showing the SER achieved for a different number of antenna elements for QAM user signaling, with block processing of the complex input signal.

FIG. 10 is a graph showing the speed of convergence for QAM user signaling for a ten antenna elements beamforming system, adaptive block processing of the complex input signal.

FIG. 11 is a block diagram view showing application of the method for system identification.

FIG. 12 is a block diagram showing application of the inventive system for purposes of adaptive line signal enhancement.

FIG. 13 is a block diagram view showing application of the method as a signal adaptive equalizer.

DETAILED DESCRIPTION OF THE INVENTION

One of the challenging tasks in designing wireless receivers, for example, those operating with QPSK, is retrieving the wanted signals from its mixture with unknown or interfering factors. As noted in the Background of the Invention above, several methods for ICA with complex signals have been proposed. The complex fast-ICA algorithm is a highly efficient block algorithm in stationary or slow time varying channel conditions. However, owing to its inherent fixed-point assumption, the complex fast-ICA lacks the ability to perform in a linearly changing or time-varying environment. Set forth herein is a novel complex adaptive ICA algorithm including individual adaptation of parameters. In the novel method, expressed as a series of steps, a convergence factor is attained that is particular for each adaptive filter coefficient and is updated at each block reiteration. As noted in the Glossary of Terms above, a block is the length of a bit string. The length of the string is obviously a variable that may controlled by the system designer. A block algorithm operates on a block matrix and its elements obtained from the observation matrix or weight vector of interest.

In the present method, there are also independent convergence factors, optimally derived for the real and imaginary parts of the weight vector. The complex adaptive ICA with individual element adaptation (complex IA-ICA) algorithm is applied to interference suppression in wireless QPSK receivers. The performance of the complex IA-ICA algorithm has been compared to the well-known complex fast-ICA, however, simulation results confirm the superiority of the new algorithm, as set forth below.

Shown in FIG. 1 is a proposed receiver structure and signal model, showing an adaptive low-IF receiver structure. Other applicable receiver structures are OFDM-MIMO and SIMO systems. Therein, mixing matrices are determined by fading coefficients of wireless channels. Fading coefficients, owing to their complex nature, introduce amplitude and phase changes to the desired signal and in addition may cause or permit an unwanted signal to interfere with the desired signal. The signals $r_1(t)$ and $r_2(t)$ received at the two antennas of the receiver undergo complex down-conversion to baseband by mixers 10/12 and 22/24. Further shown therein are bandpass filters 14 and 16 as well as respective corresponding analog-to-digital (A/D) converters 18 and 20.

The fading coefficients may be modeled as linear and time-varying, requiring that the mixing matrix (A) becomes:

$$A = \begin{bmatrix} f_{s1} + l\Delta(1+j) & f_{i1} + l\Delta(1+j) \\ f_{s2} + l\Delta(1+j) & f_{i2} + l\Delta(1+j) \end{bmatrix} \quad (1)$$

where, l=1, 2, . . . , L, $\Delta$ is the parameter reflecting the speed of channel variation in amplitude and phase L is the block size. After a two-stage complex down-conversion to baseband, as shown in FIG. 1, the elements $X_1(n)$ and $X_2(n)$ of a baseband observation vector X and are given by:

$$\begin{bmatrix} X_1(n) \\ X_2(n) \end{bmatrix} = \begin{bmatrix} f_{s1} + l\Delta(1+j) & f_{i1} + l\Delta(1+j) \\ f_{s2} + l\Delta(1+j) & f_{i2} + l\Delta(1+j) \end{bmatrix} \begin{bmatrix} s(n) \\ i(n) \end{bmatrix} \quad (2)$$

s(n) and i(n) denote the elements of the baseband source signal vector S of the desired signal and the interfering signal respectively.

Recently, an optimum block adaptive ICA method with individual adaptation parameters (OBA-ICA) was proposed. (See above referenced article to Mikhael and Yang.) In both the complex IA-ICA and the OBA-ICA, signals are represented in a similar way at the beginning of these algorithms.

To solve signal model (2) above, the novel complex IA-ICA method is applied. A brief description of the inventive method is as follows:

Step 1: The observation matrix X is whitened by decomposing its co-variance matrix.

Step 2: The first row of the weight vector w is initialized to a random vector of unit length and the iteration index k is set to 0.

Step 3: The real and imaginary parts of the weight vector $w_R(k)$ and $w_I(k)$, respectively, are updated by the following equations:

$$w_R(k+1) = w_R(k) + [MU]_{kR}\nabla_{BR}(k) \quad (3)$$

$$w_I(k+1) = w_I(k) + [MU]_{kI}\nabla_{BI}(k) \quad (4)$$

where $$[MU]_k = \begin{bmatrix} \mu_{BI}(k) & \cdots & 0 \\ \cdots & \cdots & \cdots \\ 0 & \cdots & \mu_{BM}(k) \end{bmatrix}$$

is the convergence factor, one for each row of the weight vector and independent for the real and imaginary components of the weight vector.

$$\nabla_{BR}(k) = \frac{\partial\{kurt^H(k)kurt(k)\}}{\partial w_R(k)} \quad (5)$$

$$= \frac{8}{L}[\text{Re}\{[G]_k^T[C]_k\}kurt(k)]$$

$$\nabla_{BI}(k) = \frac{\partial\{kurt^H(k)kurt(k)\}}{\partial w_I(k)} \quad (6)$$

$$= \frac{8}{L}[\text{Im}\{[G]_k^T[C]_k\}kurt(k)]$$

Re{.} and Im{.} represent the real and imaginary parts of the {.}, respectively kurt(k) is a column vector containing the kurtosis values of w(k)X, given by:

$$kurt(k) = |w(k)^H X|^4 \quad (7)$$

$[G]_k = [X_1(k)\ X_2(k)\ \ldots\ X_L(k)]^T$: The observation matrix at the kth iteration of X, L being the block size is $$[C]_k = \text{diag}[\{w(k)^H X\}^* | w(k)^H X|^2] \quad (8)$$

is a diagonal matrix, * representing the complex conjugate, and H denoting the Hermitian.

To solve (3) and (4), one obtains the optimum convergence factors $[MU]_{kR}$ and $[MU]_{kI}$. To achieve this, the total squared kurtosis is maximized to the real and imaginary components of the weight vector independently. Substituting these optimal convergence factors in (3) and (4), we obtain the weight update equations for the complex IA-ICA as follows:

$$w_R(k+1) = w_R(k) - 0.25[R_R]_k^{-1}q_R(k) \quad (9)$$

$$w_I(k+1) = w_I(k) - 0.25[R_I]_k^{-1}q_I(k) \quad (10)$$

the subscripts R and I below representing the real and imaginary components, where $$q_R(k) = Re(X[C])kurt(k) \quad (11)$$

$$q_R(k) = Im(X[C])kurt(k) \quad (12)$$

$$[R_R]_k = [Re(CX^T)]^T Re(CX^T) \quad (13)$$

$$[R_I]_k = [Im(CX^T)]^T Im(CX^T) \quad (14)$$

The complex weight vector is then updated by:

$$w(k+1) = w_R(k) + jw_I(k) \quad (15)$$

Step 4: w(k+1) is then normalized to unit length.

Step 5: The convergence of w(k+1) is then checked. If the convergence has not been reached, proceed to Step 3; otherwise continue to Step 6.

Step 6: The second row of the weight vector is then set to

[w(2)−w(1)]

A complex signal fast ICA is a fast fixed-point algorithm capable of separating complex valued, linearly mixed source signals. To employ the complex fast-ICA, Step 3 is replaced by $$w(k+1) = \frac{1}{L}\sum_{n=1}^{L}\{x(n)[w(k)^H x(n)]^* - 2w(k)\}|w(k)^H x(n)|^2 \quad (16)$$

where, x(n) is the observation data vector.

In simulations, the performance of the resultant complex IA-ICA algorithm 26 (see FIG. 1) was compared with the existing complex fast-ICA in linearly time varying and abruptly varying channel conditions. The symbol error rate and speed of convergence in terms of the number of iterations are used as a measure of performance. See FIGS. 2-5. The signal model given in equation (2) with Δ=0.0022 is used to simulate the linearly flat fading scenario. The SER achieved by both algorithms and the number of iterations required for convergence are illustrated in FIGS. 2 and 3, respectively. Simulation results show that as the block length increases, the complex fast-ICA requires many more iterations to achieve comparable interference suppression and SER as the Complex IA-ICA. An abruptly fading channel is modeled by simulating an instantaneous change in the mixing matrix coefficients in the middle of the processing block. When this happens, the complex ICA algorithms must quickly recover from this variation and re-converge to a new demixing matrix before the end of the data block. In this scenario, the convergence speed and accuracy of the Complex fast-ICA and Complex IA-ICA are compared for different block lengths L. For each L, the performance is averaged over 100 Monte Carlo runs for a SNR of 20 dB. The SER realized and the number of iterations for convergence for different L are illustrated in FIGS. 4 and 5, respectively. From the extensive simulation results presented, it is evident that the proposed Complex IA-ICA algorithm converges in less than 20 iterations with excellent accuracy, in both linearly and abruptly flat fading conditions. This can be attributed to the individual convergence factors optimally derived for each component of each weight, which optimizes the degrees of freedom of the adaptive system. As a result, it is highly effective in tracking the linear and abrupt variations in the complex channel parameters.

Complex Adaptive Least Mean Square Methods Employing Optimal Time-Varying Convergence Factors (Complex OBA-LMS, Complex OBAI-LMS, Complex HA-LMS, and Complex IA-LMS)

The Complex Least Mean Square (Complex LMS) method has been widely used in various adaptive filtering applications because of its computational simplicity and relative ease of implementation. However, the inherent limitation of the Complex LMS is its dependence on the convergence factor or step size, which is fixed and has to be manually selected depending on the type of application or nature of the input signal. Moreover, a small step size results in slow convergence, and a large step size could cause unstable gradient descent, leading to divergence. Hence, the optimal convergence factor has to be chosen by trial and error. In this chapter, formulations for two novel complex block adaptive algorithms are presented that automatically derive optimal convergence factors for the real and imaginary components of the complex adaptive filter coefficients. In addition, the proposed methods independently update the real and imaginary parts of the adaptive filter coefficients at each block iteration. The algorithms are called Complex Optimum Block Adaptive LMS (Complex OBA-LMS) and Complex Optimum Block Adaptive LMS with Individual Adaptation (Complex OBAI-LMS), including their sequential (non-block) versions, namely, Complex LMS with Homogeneous Adaptation (Complex HA-LMS) and Complex LMS with Individual Adaptation (Complex IA-LMS), respectively. In the Complex OBA-LMS, two optimal convergence factors are separately derived at each iteration, one for the real components, and one for the imaginary components of the complex adaptive filter coefficients. On the other hand, the Complex OBAI-LMS derives a unique convergence factor for each component of each complex adaptive filter weight. As a result, it is most efficient in utilizing all the degrees of freedom of the adaptive filter. The formulation of the Complex OBA-LMS and the Complex OBAI-LMS are presented in the following sections.

Complex OBA-LMS: Formulation

The following parameters are defined:

k: block iteration index

N: Length of the adaptive filter

L: Processing Block length j: complex operator i.e. $\sqrt{-1}$ $E_l(k)$: l th complex error signal in the k th block $W_i(k)$: the i th adaptive filter coefficient in the k th block As mentioned previously, the Complex OBA-LMS generates time-varying convergence factors that are updated at each block iteration, for the real and imaginary components of the complex adaptive filter coefficients, in contrast to the constant convergence factor of the Complex LMS. Let these time-varying convergence factors for the real and imaginary components be denoted as $\mu_{BR}(k)$ and $\mu_{BI}(k)$ respectively. Incorporating these convergence factors, we obtain the following weight update equations for the real and imaginary components of the complex adaptive filter coefficients, $$W_R(k+1) = W_R(k) - \mu_{BR}(k)\nabla_{BR}(k) \quad (17)$$

$$W_I(k+1) = W_I(k) - \mu_{BI}(k)\nabla_{BI}(k) \quad (18)$$

where, $$\nabla_{BR}(k) = \frac{1}{L}\frac{\partial\{\underline{e}^H(k)\underline{e}(k)\}}{\partial\{W_R(k)\}} \quad (19)$$

$$\nabla_{BI}(k) = \frac{1}{L}\frac{\partial\{\underline{e}^H(k)\underline{e}(k)\}}{\partial\{W_I(k)\}} \quad (20)$$

$$\underline{e}(k) = [e_1(k) \ldots e_L(k)] \quad (21)$$

Evaluating (19) and (20) we obtain, $$\nabla_{BR}(k) = \frac{1}{L}[-X_k^T \underline{e}^*(k) - X_k^H \underline{e}(k)] \quad (22)$$

$$\nabla_{BI}(k) = \frac{1}{L}[-jX_k^T \underline{e}^*(k) + jX_k^H \underline{e}(k)] \quad (23)$$

where, $X_k$ is the L×N matrix of input signal samples given as:

$$X_k = \begin{bmatrix} x_{11}(k) & \ldots & x_{1N}(k) \\ \ldots & & \\ \ldots & & \\ x_{L1}(k) & \ldots & x_{LN}(k) \end{bmatrix} \quad (24)$$

T and * represent transpose and complex conjugate respectively.

The l th complex error signal $e_l(k+1)$ in the (k+1) th block, can be expressed in terms of the l th complex error signal $e_l(k)$ in the k th block, and the present adaptive filter coefficients $W_R(k)$ and $W_I(k)$ by applying the Taylor's series as follows:

$$e_l(k+1) = e_l(k) + \sum_{i=1}^{N}\frac{\partial e_l(k)}{\partial w_{iR}(k)}\Delta W_{iR}(k) + \ldots \quad (25)$$

$l = 1, 2 \ldots L$ $$e_l(k+1) = e_l(k) + \sum_{i=1}^{N}\frac{\partial e_l(k)}{\partial w_{iI}(k)}\Delta W_{iI}(k) + \ldots \quad (26)$$

$l = 1, 2 \ldots L$ where, $$\Delta W_{iR}(k) = W_{iR}(k+1) - W_{iR}(k) \quad (27)$$

$$\Delta W_{iI}(k) = W_{iI}(k+1) - W_{iI}(k) \quad (28)$$

Due to linearity of the error function, higher order derivatives in the Taylor series expansion are ignored. Expanding (25) and (26) for all the L error signals, we obtain the expressions:

$$\underline{e}(k+1) = \underline{e}(k) - X_k\Delta W_R(k) \quad (29)$$

$$\underline{e}(k+1) = \underline{e}(k) - jX_k\Delta W_I(k) \quad (30)$$

Re {.} and Im {.} represent the real and imaginary components of {.}, respectively.

From (17) and (18) we have, $$\Delta W_R(k) = -\mu_{BR}(k)\nabla_{BR}(k) \quad (31)$$

$$\Delta W_I(k) = -\mu_{BI}(k)\nabla_{BI}(k) \quad (32)$$

Substituting (31) and (32) in (29) and (30), respectively, we obtain:

$$\underline{e}(k+1) = \underline{e}(k) + \mu_{BR}(k)X_k\nabla_{BR}(k) \quad (33)$$

$$\underline{e}(k+1) = \underline{e}(k) + j\mu_{BI}(k)X_k\nabla_{BI}(k) \quad (34)$$

The optimal convergence factors $\mu_{BR}(k)$ and $\mu_{BI}(k)$ should minimize the energy in the complex error signal $\underline{e}(k)$, i.e. the following conditions should be satisfied.

$$\frac{\partial\{\underline{e}^H(k+1)\underline{e}(k+1)\}}{\partial\mu_{BR}(k)} = 0 \quad (35)$$

$$\frac{\partial\{\underline{e}^H(k+1)\underline{e}(k+1)\}}{\partial \mu_{BI}(k)} = 0 \quad (36)$$

Evaluating (35) and (36), we obtain $$\mu_{BR}(k) = \frac{-\underline{e}(k)^H X_k \nabla_{BR}(k) - \nabla_{BR}^H(k) X_k^H \underline{e}(k)}{2 * \nabla_{BR}^H(k) X_k^H X_k \nabla_{BR}(k)} \quad (37)$$

$$\mu_{BI}(k) = \frac{-\underline{e}(k)^H j X_k \nabla_{BI}(k) + \nabla_{BI}^H(k) j X_k^H \underline{e}(k)}{2 * \nabla_{BI}^H(k) X_k^H X_k \nabla_{BI}(k)} \quad (38)$$

By substituting (37) and (38) in (17) and (18), and applying $W(k+1)=W_R(k+1)+jW_I(k+1)$, the Complex OBA-LMS algorithm is obtained.

A sequential version of the Complex OBA-LMS, called the Complex LMS with homogeneous adaptation (Complex HA-LMS) is presented in the following section.

Complex HA-LMS: Formulation

The Complex HA-LMS is the sequential version of the Complex OBA-LMS. Since the input is processed in samples, the error signal at the k th iteration, e(k), is given as:

$$e(k)=d(k)-W^H X(k) \quad (39)$$

d(k) and X(k) are the desired signal sample and input signal vector, respectively In the Complex HA-LMS, the convergence factors $\mu_R(k)$ and $\mu_I(k)$ are optimally derived and updated at every sample iteration, as compared to block iteration for the Complex OBA-LMS. Hence, the expressions for $\nabla_R(k)$ and $\nabla_I(k)$ in (19) and (20) are modified as:

$$\nabla_R(k) = \frac{\partial\{e^*(k)e(k)\}}{\partial\{W_R(k)\}} \quad (40)$$
$$= -X(k)e^*(k) - X^*(k)e(k)$$

$$\nabla_I(k) = \frac{\partial\{e^*(k)e(k)\}}{\partial\{W_I(k)\}} \quad (41)$$
$$= e^*(k)jX(k) - e(k)jX^*(k)$$

Similar to (25) and (26), the Taylor's series expansion for the (k+1) th complex error sample e(k+1), in terms of the k th complex error sample e(k), and the present adaptive filter coefficients $W_R(k)$ and $W_I(k)$ is expressed as:

$$e(k+1) = e(k) + \sum_{i=1}^{L} \frac{\partial e(k)}{\partial w_{iR}(k)} \Delta W_{iR}(k) + \dots \quad (42)$$

$$e(k+1) = e(k) + \sum_{i=1}^{L} \frac{\partial e(k)}{\partial w_{iI}(k)} \Delta W_{iI}(k) + \dots \quad (43)$$

where, $$\Delta W_{iR}(k) = W_{iR}(k+1) - W_{iR}(k) \quad (44)$$

$$\Delta W_{iI}(k) = W_{iI}(k+1) - W_{iI}(k) \quad (45)$$

Evaluating (42) and (43), and substituting (44) and (45) in the resulting expression, we obtain the following:

$$e(k+1)=e(k)-X^T(k)\Delta W_R(k) \quad (46)$$

$$e(k+1)=e(k)+jX^T(k)\Delta W_I(k) \quad (47)$$

Substituting (31) and (32) in (46) and (47), we have:

$$e(k+1)=e(k)+X^T(k)\mu_R(k)\nabla_R(k) \quad (48)$$

$$e(k+1)=e(k)-jX^T(k)\mu_I(k)\nabla_I(k) \quad (49)$$

The novel adaptation approach proposed in this invention involves optimizing the error function with respect to $\mu_R$ and $\mu_I$, independently, i.e.

$$\frac{\partial\{e^*(k+1)e(k+1)\}}{\partial \mu_R(k)} = 0 \quad (50)$$

$$\frac{\partial\{e^*(k+1)e(k+1)\}}{\partial \mu_I(k)} = 0 \quad (51)$$

Evaluating (50) and (51), we obtain $$\mu_R(k) = \frac{-e(k)^* X^T(k)\nabla_R(k) - \nabla_R^H(k) X^*(k) e(k)}{2 * \nabla_R^H(k) X(k) X^H(k) \nabla_R(k)} \quad (52)$$

$$\mu_I(k) = \frac{-e(k)^* j X^T(k)\nabla_I(k) + \nabla_I^H(k) j X^*(k) e(k)}{2 * \nabla_I^H(k) X(k) X^H(k) \nabla_I(k)} \quad (53)$$

In this manner, the Complex HA-LMS is formulated.

Complex OBAI-LMS: Formulation

The Complex OBAI-LMS is a block adaptive algorithm that derives a unique convergence factor for each component of each complex adaptive filter coefficient. In addition, the real and imaginary components of the complex filter weights are updated independently. Consequently, for a complex weight vector W of length N, 2N convergence factors are optimally derived for the real and imaginary components of W. Hence, the real and imaginary components of the complex weight vector W, namely $W_R$ and $W_I$ respectively, are updated by the following equations:

$$w_R(k+1)=w_R(k)-[MU]_{Rk}\nabla_{BR}(k) \quad (54)$$

$$w_I(k+1)=w_I(k)-[MU]_{Ik}\nabla_{BI}(k) \quad (55)$$

$[MU]_{Rk}$ and $[MU]_{Ik}$ are diagonal matrices of order N, whose elements are the convergence factors for the real and imaginary components of W, i.e.

$$[MU]_{Rk} = \begin{bmatrix} \mu_{R1}(k) & \dots & 0 \\ \dots & \dots & \dots \\ 0 & \dots & \mu_{RN}(k) \end{bmatrix} \quad (56)$$

$$[MU]_{Ik} = \begin{bmatrix} \mu_{I1}(k) & \dots & 0 \\ \dots & \dots & \dots \\ 0 & \dots & \mu_{IN}(k) \end{bmatrix} \quad (57)$$

Expanding the L complex error signals in a Taylor series expansion similar to (25) and (26), we obtain the error expression in a matrix-vector form as:

$$\underline{e}(k+1)=\underline{e}(k)-X_k\Delta W_R(k) \quad (58)$$

$$\underline{e}(k+1)=\underline{e}(k)-jX_k\Delta W_I(k) \quad (59)$$

From (54) and (55), we have $$\Delta W_R(k)=-[MU]_{Rk}\nabla_{BR}(k) \quad (60)$$

$$\Delta W_I(k)=-[MU]_{Ik}\nabla_{BI}(k) \quad (61)$$

Substituting (60) and (61) in (58) and (59), respectively, we obtain:

$$\underline{e}(k+1) = \underline{e}(k) + X_k [MU]_{Rk} \nabla_{BR}(k) \qquad (62)$$

$$\underline{e}(k+1) = \underline{e}(k) + j X_k [MU]_{Ik} \nabla_{BI}(k) \qquad (63)$$

The 2N convergence factors are chosen such that the sum of the squares of the magnitudes of the complex error signals is minimized in the next iteration, i.e.

$$\frac{\partial \{\underline{e}^H(k+1)\underline{e}(k+1)\}}{\partial \mu_{Ri}(k)} = 0 \qquad (64)$$
$$i = 1, 2, \ldots, N$$

$$\frac{\partial \{\underline{e}^H(k+1)\underline{e}(k+1)\}}{\partial \mu_{Ii}(k)} = 0 \qquad (64)$$
$$i = 1, 2, \ldots, N$$

For simplicity, we define the following parameters:

$$z_R(k) = Re\{X_k^H \underline{e}(k)\} = [z_{R1}(k) z_{R2}(k) \ldots z_{RN}(k)]^T \qquad (65)$$

$$z_I(k) = Im\{X_k^H \underline{e}(k)\} = [z_{I1}(k) z_{I2}(k) \ldots z_{IN}(k)]^T \qquad (66)$$

$$[R]_k = X_k^H X_k = [R_{mn}(k)]$$

$$1 \leq m, n \leq N \qquad (67)$$

Rewriting (62) as follows:

$$\underline{e}^H(k+1)\underline{e}(k+1) = S_1 + S_2 + S_3 + S_4 \qquad (68)$$

where, $$S_1 = \underline{e}^H(k)\underline{e}(k) \qquad (69)$$

$$S_2 = \underline{e}^H(k) X_k [MU]_{Rk} \nabla_{BR}(k) \qquad (70)$$

$$S_3 = \nabla_{BR}^H(k) [MU]_{Rk} X_k^H \underline{e}(k) \qquad (71)$$

$$S_4 = \nabla_{BR}^H(k) [MU]_{Rk} [R]_k [MU]_{Rk} \nabla_{BR}(k) \qquad (72)$$

It is worth mentioning that since the gradient vectors are real, $\nabla_{BR}^H(k) = \nabla_{BR}^T(k)$.

Expressing equations (69) to (72) in summation form we obtain:

$$S_1 = \sum_{i=1}^{L} e_i^2(k) \qquad (73)$$

$$S_2 = \sum_{i=1}^{N} [e^H(k) X_k]_i \mu_{Ri}(k) \nabla_{BRi}(k) \qquad (74)$$

$$S_3 = \sum_{i=1}^{N} \mu_{Ri}(k) \nabla_{BRi}(k) [X_k^H e(k)]_i \qquad (75)$$

$$S_4 = \sum_{m=1}^{N} \left[ \sum_{n=1}^{N} \mu_{Rn}(k) \nabla_{BRn}(k) R_{mn}(k) \right] \mu_{Rm}(k) \nabla_{BRm}(k) \qquad (76)$$

Combining (74) and (75) yields the following:

$$S_2 + S_3 = \sum_{i=1}^{N} \mu_{Ri}(k) \nabla_{BRi}(k) \{[e^H(k) X_k]_i + (k)[X_k^H e(k)]_i\} \qquad (77)$$

$$= 2 \sum_{i=1}^{N} \mu_{Ri}(k) \nabla_{BRi}(k) Re\{[X_k^H e(k)]_i\}$$

$$= 2 \sum_{i=1}^{N} \mu_{Ri}(k) \nabla_{BRi}(k) z_{Ri}(k)$$

Substituting (68) in (64) gives the following:

$$\frac{\partial S_1}{\partial \mu_{Ri}(k)} + \frac{\partial (S_2 + S_3)}{\partial \mu_{Ri}(k)} + \frac{\partial S_4}{\partial \mu_{Ri}(k)} = 0 \qquad (78)$$
$$i = 1, 2, \ldots, N$$

Substituting (73), (77) and (76) in (78), and using the symmetry of $[R]_k$ given by (67), the following result is obtained:

$$[MU]_{Rk} \nabla_{BR}(k) = -[R]_k^{-1} z_R(k) \qquad (79)$$

In order to compute $[MU]_{Ik}$, a similar procedure is followed in evaluating (64). As a result, we obtain the following expression:

$$[MU]_{Ik} \nabla_{BI}(k) = -[R]_k^{-1} z_I(k) \qquad (80)$$

Substituting (79) and (80) in (54) and (55), we obtain the following update equations for the real and imaginary components of W as follows:

$$w_R(k+1) = w_R(k) + [R]_k^{-1} z_R(k) \qquad (81)$$

$$w_I(k+1) = w_I(k) + [R]_k^{-1} z_I(k) \qquad (82)$$

In this manner, the Complex OBAI-LMS algorithm is obtained.

Complex IA-LMS: Formulation

The Complex IA-LMS is the sequential version of the Complex OBAI-LMS. Hence, (62) and (63) are reduced to sample form:

$$e(k+1) = e(k) + X^T(k) [MU]_{Rk} \nabla_R(k) \qquad (83)$$

$$e(k+1) = e(k) - j X^T(k) [MU]_{Ik} \nabla_I(k) \qquad (84)$$

Similar to Complex OBAI, the 2N convergence factors are optimally derived such that the square of the magnitude of the error sample is minimized in the subsequent iteration, i.e.

$$\frac{\partial \{e^*(k+1)e(k+1)\}}{\partial \mu_{Ri}(k)} = 0 \qquad (85)$$
$$i = 1, 2, \ldots, N$$

$$\frac{\partial \{e^*(k+1)e(k+1)\}}{\partial \mu_{Ii}(k)} = 0 \qquad (86)$$
$$i = 1, 2, \ldots, N$$

From (83), the expression $e^*(k+1)e(k+1)$ can be written in summation form as follows:

$$e^*(k+1)e(k+1) = \qquad (87)$$

$$2 * \left[ \sum_{i=1}^{N} \mu_{Ri}(k) \nabla_{Ri}(k) Re\{x_i^*(k) e(k)\} \right] + \left( \sum_{n=1}^{N} |x_i(k)| \mu_{Ri}(k) \nabla_{Ri}(k) \right)^2$$

Applying (85) for all i, we obtain the following equations in matrix form:

$$\begin{bmatrix} \mathrm{Re}\{x_1^*(k)e(k)\} \\ \vdots \\ \mathrm{Re}\{x_N^*(k)e(k)\} \end{bmatrix}^T = \begin{bmatrix} |x_1(k)|[\mathrm{Re}\{x_1^*(k)e(k)\}] \\ \vdots \\ |x_N(k)|[\mathrm{Re}\{x_N^*(k)e(k)\}] \end{bmatrix}^T \begin{bmatrix} \mu_{R1} \\ \vdots \\ \mu_{RN} \end{bmatrix} \begin{bmatrix} |x_1(k)| \\ \vdots \\ |x_N(k)| \end{bmatrix}^T \quad (88)$$

Defining the following parameters:

$$Y_{Rk} = \begin{bmatrix} \mathrm{Re}\{x_1^*(k)e(k)\} \\ \vdots \\ \mathrm{Re}\{x_N^*(k)e(k)\} \end{bmatrix}^T, Z_{Rk} = \begin{bmatrix} |x_1(k)|[\mathrm{Re}\{x_1^*(k)e(k)\}] \\ \vdots \\ |x_N(k)|[\mathrm{Re}\{x_N^*(k)e(k)\}] \end{bmatrix}^T$$

and $$R_k = \begin{bmatrix} |x_1(k)| \\ \vdots \\ |x_N(k)| \end{bmatrix}^T$$

(88) becomes:

$$Y_{Rk} = Z_{Rk} \begin{bmatrix} \mu_{R1} \\ \vdots \\ \mu_{RN} \end{bmatrix} R_k \quad (89)$$

In this manner, the individual convergence factors for the updating the real component of the weight vector are obtained as:

$$\begin{bmatrix} \mu_{R1} \\ \vdots \\ \mu_{RN} \end{bmatrix} = Z_{Rk}^{\#} Y_{Rk} R_k^{\#} \quad (90)$$

where, $Z_{Rk}^{\#}$ and $R_k^{\#}$ denote the pseudo-inverses of $Z_{Rk}^{\#}$ and $R_k^{\#}$, respectively.

Following a similar approach for the convergence factors for the imaginary component of the weight vector are derived as:

$$\begin{bmatrix} \mu_{I1} \\ \vdots \\ \mu_{IN} \end{bmatrix} = Z_{Ik}^{\#} Y_{Ik} R_k^{\#} \quad (91)$$

where, $$Y_{Ik} = \begin{bmatrix} \mathrm{Im}\{x_1^*(k)e(k)\} \\ \vdots \\ \mathrm{Im}\{x_N^*(k)e(k)\} \end{bmatrix}^T \quad (92)$$

$$Z_{Ik} = \begin{bmatrix} -|x_1(k)|[\mathrm{Im}\{x_1^*(k)e(k)\}] \\ \vdots \\ -|x_N(k)|[\mathrm{Im}\{x_N^*(k)e(k)\}] \end{bmatrix}^T \quad (93)$$

Incorporating these convergence factors in the weight update equations, the Complex IA-LMS algorithm is obtained.

The invented methods employing optimally derived convergence factors are applied as part of the adaptive beamforming system 27, shown in FIG. 6. The Complex OBA-LMS and Complex OBAI-LMS are applied when the signal is processed in blocks, and the Complex HA-LMS and Complex IA-LMS are employed when sequential processing is adopted at the beamforming receiver. The performance of these techniques is compared to the block and sequential versions of the Complex LMS method. In contrast to the Complex LMS, simulation results show that the proposed methods exhibit improved convergence speed and accuracy, irrespective of the flat fading channel parameters, number of antenna elements, and type of modulation employed by the users.

In FIG. 6, the invented adaptive beamforming system with L antenna elements is shown, with d being the spacing between the elements. Let θ be the direction of arrival or the incidence angle of the wavefronts of a particular user, and λ be the wavelength. Considering the sensor or antenna at the bottom end of the antenna array as the reference, the steering vector S(φ) is defined by:

$$s(\phi) = [1, e^{-j\phi}, \ldots, e^{-j(L-1)\phi}]^T \quad (93)$$

where, φ is the phase of the incident wave relative to the reference antenna given by:

$$\phi = \frac{2\pi d}{\lambda} \sin\theta \quad (94)$$

Considering M users, the output of each array element is given by:

$$x_l(k) = \sum_{i=1}^{M} A_i s_i(k) e^{j\omega t_l(\theta_i)} + n_l(k) = r_l(k) + n_l(k) \quad 1 \le l \le L \quad (95)$$

where, $s_i(k)$ is the user symbol for source i at time index k, $r_l(k)$ is the received signal at element l, and $n_l(k)$ is additive white complex gaussian noise. Furthermore, $t_l(\theta_i)$ is the time delay at element l for user i, with direction of arrival $\theta_i$. Assuming a flat fading channel, $A_i$ is the complex fading channel parameter.

Expressing (95) in vector form for all the L elements, we obtain $$X(k) = R(k) + N(k) \quad (96)$$

Source 1 or the reference signal 28 is considered to be the desired user and the remaining sources are the interferers. Hence, the Signal to Interference Ratio (SIR), for interferer i is given by $$\mathrm{SIR}_i = |A_1|^2/|A_i|^2$$

$$2 \le i \le M \quad (97)$$

The output of the adaptive beamformer is given by $$y(k) = W^H X(k) \quad (98)$$

where $W = [w_1(k) \, w_2(k) \, \ldots \, w_L(k)]$ is the complex weight vector of the adaptive beamformer and H denotes the conjugate transpose. The invented beamforming system iteratively tries to computes the optimal W that minimizes the MSE 29, between the desired user symbol $s_1(k)$ and y(k), i.e.

$$e(k) = s_1(k) - y(k) \quad (99)$$

Prior adaptive beamforming systems employing the traditional Complex LMS and the Block Complex LMS are widely used because of their low computational complexity and ease of implementation. However, their convergence properties and performance are greatly dependent on the convergence factor µ, which is fixed and has to be manually selected. In addition, an improper choice of µ even results in divergence. The convergence properties of the adaptive beamforming system employing the invented methods are compared to the Complex LMS and Block Complex LMS for both sequential and block processing, respectively.

In the simulations, the performance of the invented beamforming techniques is compared for different number of array elements (L) that are separated half a wavelength apart and supporting 6 users. Without loss of generality, the corresponding Angles of Arrival (AOA) of the user signals are shown in Table 1. Furthermore, the performance is compared for both QAM modulated user signaling, for an SNR of 25 dB.

TABLE 1

AOA simulated for the different users in degrees

| User i | 1 | 2 | 3 | 4 | 5 | 6 |
|---|---|---|---|---|---|---|
| AOA (degrees) | 0 | −45 | 30 | −20 | −10 | 18 |

Assuming flat fading, the complex channel parameters $A_i$ in (97) were randomly generated for each simulation run to ensure a thorough performance evaluation under diverse channel conditions i. In addition, L was varied between 10 and 15 elements. For each L, the performance was averaged over 100 independent simulation runs. The SER (dB) vs. L achieved by the Complex LMS and proposed Complex HA-LMS and Complex IA-LMS methods for QAM signaling is illustrated in FIG. 7. The corresponding SER (dB) vs. Number of processed samples for L=10 is shown in FIG. 8. Without loss of generality, the performance improvement achieved by the invented beamforming systems is maintained for other complex-valued modulation schemes such as QPSK or other values of SIR.

For processing user signals in block mode, the invented Complex OBA-LMS and Complex OBAI-LMS techniques, are applied to the adaptive beamforming problem. In this regard, the performance of the Complex OBA-LMS and Complex OBAI-LMS are compared to the block Complex LMS for different number of antenna elements. In addition, the processing block length is set as 2 L in all the simulations.

For QAM signaling, and a $SIR_i=0$ dB, for all i, the SER (dB) vs. L achieved by the Block Complex LMS and invented Complex OBA-LMS and Complex OBAI-LMS algorithms is shown in FIG. 9. The corresponding SER (dB) vs. Number of processed samples for L=10 is shown in FIG. 10.

Simulation results show that in contrast to the prior adaptive systems employing the Complex LMS and Block Complex LMS, the invented adaptive systems employing Complex OBA-LMS, Complex OBAI-LMS, Complex HA-LMS and Complex IA-LMS yields consistent performance in both block and sequential processing of the complex signal input, irrespective of the number of array elements, without having to manually select a convergence factor for each application.

As may be seen in FIG. 11, the present adaptive system for processing of complex signals may also be employed in system identification applications. The objective of the adaptive system 35 is to change its coefficients to match the response of the unknown system 31. The complex signal input 30 is divided into parts 30a and 30b, part 30a of which is then applied to an unknown system 31 and 30b to the new complex adaptive system 35. The responses 34 and 36 of 31 and 35 respectively, are fed to node 32 which generates a complex error signal 33, which is then fed into system 35. On the basis of this error measure, the adaptive system will generate optimal convergence factors in an attempt to reduce the error. The coefficients of the adaptive system 35 will, it is believed, prove useful in system identification.

In FIG. 12, is shown an application of the instant methods for purposes of Adaptive Line Enhancement (ALE). The objective of ALE is to remove noise from a complex sinusoidal signal. The input 39 to the system is a complex noisy signal u(n), consisting of a complex sinusoidal component s(n) and the noise n(n). The system depicted includes a de-correlation stage 40, symbolized by $z^{-\Delta}$, and an adaptive predictor 42 using the Complex OBA-LMS/OBAI-LMS or Complex HA/IA-LMS techniques. The de-correlation stage attempts to remove any correlation that may exist, between the samples of noise, by shifting them Δ samples apart. As a result, the predictor can only make a prediction about the sinusoidal component of u(n). The predictor adapts its parameters by using individual convergence factors for each component of each of its weights to minimize the instantaneous squared error output. The output 43 of the predictor is subtracted from u(n) in node 44, to generate an error signal 45 which constitutes the feedback to the adaptive predictor 42.

With reference to FIG. 13, there is shown the use of the inventive methods as a part of a system for adaptive equalization, to compensate for distortion caused by the time-varying wireless channel 48. The training sequence $s_k$ is fed to 48 and a delay block 56. Internal Noise $n_k$ is added to the response of 48 at node 50, and fed into the adaptive equalizer 52, which employs the Complex OBA-LMS/OBAI-LMS or Complex HA/IA-LMS techniques. The training sequence $s_k$ is delayed by Δ samples in delay block 56 and subtracted from output 53 before node 54 to generate a complex error signal 55. The adaptive equalizer thus reduces the magnitude of signals 55 by employing the invented techniques.

While the present invention has been described in detail and pictorially shown in the accompanying drawings, these should not be construed as limitations on the scope of the present invention, but rather as an exemplification of preferred embodiments thereof. It will be apparent, however, that various modifications and changes can be made within the spirit and the scope of this invention as described in the above specification and defined in the appended claims and their legal equivalents.

We claim:

1. A method for complex adaptive filters used in independent component analysis (ICA) of a source signal after complex down-conversion thereof to a baseband, using mixing matrices, A/D converters and bandpass filters, to generate a baseband observation matrix X which includes said source signal and an interfering signal, the steps of the method including:
   (a) whitening the observation matrix X by decomposing its co-variant matrices, each component thereof having a weight vector w;
   (b) initializing an $n^{th}$ row of said weight vector w to a random vector of unit length and an iteration index k set at zero;
   (c) updating the real imaginary parts $w_r(k)$ and $w_i(k)$ of the weight vector by the equations:

$$w_R(k+1) = w_R(k) + [MU]_{kR} \nabla_{BR}(k) \quad \text{(A)}$$

$$w_I(k+1) = w_I(k) + [MU]_{kI} \nabla_{BI}(k) \quad \text{(B)}$$

where $$[MU]_k = \begin{bmatrix} \mu_{B1}(k) & \ldots & 0 \\ \ldots & \ldots & \ldots \\ 0 & \ldots & \mu_{BM}(k) \end{bmatrix} \quad (C)$$

is the convergence factor, one for each row of each weight vector, and independent for the real and imaginary components of the weight vector; and (d) solving equations (A) and (B) above by independently maximizing the total squared kurtosis of the real and imaginary components $w_R(k)$ and $w_I(k)$ of the weight vector, to optimize convergence factors [MU]kR and [MU]kl, therein obtaining continual complex weight update equations.

2. The method as recited in claim 1, in which said weight update equations of said Step (d) comprise:

$$w_R(k+1) = w_R(k) - 0.25[R_R]_k^{-1} q_R(k) \quad (D)$$

$$w_I(k+1) = w_I(k) - 0.25[R_I]_k^{-1} q_I(k) \quad (E)$$

the subscripts R and I representing the real and imaginary components, where $$q_R(k) = Re(X[C])\text{kurt}(k) \quad (F)$$

$$q_R(k) = Im(X[C])\text{kurt}(k) \quad (G)$$

$$[R_R]_k = [Re(CX^T)]^T Re(CX^T) \quad (H)$$

$$[R_I]_k = [Im(CX^T)]^T Im(CX^T) \quad (I)$$

in which the complex weight vector is then updated by:

$$w(k+1) = w_R(k) \pm j w_I(k) \quad (J)$$

3. The method as recited in claim 2, further comprising the steps of:

(e) normalizing w(k+1) to a unit length;
(f) checking the convergence of w(k+1) and if convergence has not been reached, reiterating Step (c) above, otherwise continuing to Step (g) below; and
(g) setting the second row of the weight vector to $$[w(2) - w(1)] \quad (K)$$

4. A complex fast method for adaptive filters used in independent component analysis (ICA) of a linearly mixed source signal after complex down-conversion thereof to a baseband, using mixing matrices, A/D converters and bandpass filters, to generate a baseband observation matrix X which includes said source signal and an interfering signal, the steps of the method including:

(a) whitening the observation matrix X by decomposing its co-variants matrices, each component thereof having a weight vector w;
(b) initializing an $n^{th}$ row of said weight vector w to a random vector of unit length and an iteration index k set at zero;
(c) updating real imaginary parts $w_R(k)$ and $w_I(k)$ of the weight vector by the equations:

$$w(k+1) = \frac{1}{L} \sum_{n=1}^{L} \{x(n)[w(k)^H x(n)]^* - 2w(k)\}|w(k)^H x(n)|^2 \quad (L)$$

where, x (n) is the observation data vector, L is the block size, and H denotes the Hermitian; and (d) independently maximizing the total squared kurtosis of the respective real and imaginary components $W_R(k)$ and $w_I(k)$ of the weight vector, to optimize convergence factors therein, to obtain continual complex weight update equations.

5. The method as recited in claim 4, in which said weight update equations of said step (d) comprise:

$$w_R(k+1) = w_R(k) - 0.25[R_R]_k^{-1} q_R(k) \quad (D)$$

$$w_I(k+1) = w_I(k) - 0.25[R_I]_k^{-1} q_I(k) \quad (E)$$

the subscripts R and I representing the real and imaginary components, where $$q_R(k) = Re(X[C])\text{kurt}(k) \quad (F)$$

$$q_R(k) = Im(X[C])\text{kurt}(k) \quad (G)$$

$$[R_R]_k = [Re(CX^T)]^T Re(CX^T) \quad (H)$$

$$[R_I]_k = [Im(CX^T)]^T Im(CX^T) \quad (I)$$

in which the complex weight vector is then updated by:

$$w(k+1) = w_R(k) \pm j w_I(k) \quad (J)$$

6. The method as recited in claim 5, further comprising the steps of:

(e) normalizing w(k+1) to a unit length,
(f) checking the convergence of w(k+1) and if the convergence has not been reached, reiterating Step (c) above, otherwise continuing to Step (g) below; and
(g) setting the second row of the weight vector to $$w(k+1) = w_R(k) + j w_I(k) \quad (J)$$

7. A method of signal processing at least one received signal comprising a complex source signal that is mixed with interference or distortion, said complex source signal having real and imaginary signal components, comprising:

applying an adaptive signal processing algorithm including an error function to said received signal over a plurality of iterations for minimizing said error function, wherein said adaptive algorithm generates:

an updated convergence factor at each of said plurality of iterations based on at least one parameter associated with the said received signal, wherein said adaptive algorithm at each of said plurality of iterations uses said updated convergence factor to generate updates for a plurality of complex weights comprising at least a first real weighting component and first imaginary weighting component, and a second real weighting component and second imaginary weighting component, wherein said updated convergence factors are operable to speed said minimizing of said error function of said adaptive algorithm.

8. The method of claim 7, wherein said updated convergence factors are derived independently by maximizing a total squared kurtosis at each of said plurality of iterations for said first and said second real weighting components and said first and said second imaginary weighting components.

9. The method of claim 7, wherein said updated convergence factors are derived at each of said plurality of iterations by minimizing said error function.

10. The method of claim 7, wherein said complex source signal comprises a Quadature Phase-shift keyed (QPSK) or a Quadrature Amplitude Modulated (QAM) modulated signal.

11. The method of claim 7, wherein said method comprises beamforming, speech identification, system identification, event prediction, line quality enhancement, signal equalization, or audio, speech or video processing.

12. A signal processor, comprising:
  machine readable storage or hardware for implementing an adaptive signal processing algorithm including an error function applied to at least one received signal over a plurality of iterations for minimizing said error function, wherein said received signal comprises a complex source signal that is mixed with interference or distortion, said complex signal having real and imaginary signal components;
  wherein said adaptive algorithm generates an updated convergence factor at each of said plurality of iterations based on at least one parameter associated with the said received signal, for a plurality of complex weights comprising at least a first real weighting component and first imaginary weighting component, and a second real weighting component and second imaginary weighting component,
  wherein said updated convergence factors are operable to speed said minimizing of said error function of said adaptive algorithm.

13. The signal processor of claim 12, wherein said updated convergence factors are derived independently by maximizing a total squared kurtosis at each of said plurality of iterations for said first and said second real weighting components and said first and said second imaginary weighting components.

14. The signal processor of claim 12, wherein said updated convergence factors are derived at each of said plurality of iterations by minimizing said error function.

15. A wireless receiver for processing at least one received signal comprising a complex source signal that is mixed with interference or distortion, comprising:
  a complex down converter comprising a mixer for outputting a complex baseband signal from said received signal, and
  a signal processor coupled to an output of said complex down converter to receive said complex baseband signal, said signal processor comprising:
    machine readable storage or hardware for implementing an adaptive signal processing algorithm including an error function applied to at least one received signal over a plurality of iterations for minimizing said error function, wherein said received signal comprises a complex source signal that is mixed with interference or distortion, said complex signal having real and imaginary signal components;
    wherein said adaptive algorithm generates an updated convergence factor at each of said plurality of iterations based on at least one parameter associated with the said received signal, for a plurality of complex weights comprising at least a first real weighting component and first imaginary weighting component, and a second real weighting component and second imaginary weighting component,
    wherein said updated convergence factors are operable to speed said minimizing of said error function of said adaptive algorithm.

16. The receiver of claim 15, wherein said updated convergence factors are derived by maximizing a total squared kurtosis at each of said plurality of iterations for said first and said second real weighting components and said first and said second imaginary weighting components.

17. The receiver of claim 15, wherein said updated convergence factors are derived at each of said plurality of iterations by minimizing said error function.

18. The method of claim 9, wherein said adaptive algorithm generates said updated convergence factors at each of said plurality of iterations based on a Taylor series approximation of said error function.

19. The signal processor of claim 14, wherein said adaptive algorithm generates said updated convergence factors at each of said plurality of iterations based on a Taylor series approximation of said error function.

20. The receiver of claim 17, wherein said adaptive algorithm generates said updated convergence factors at each of said plurality of iterations based on a Taylor series approximation of said error function.

* * * * *